(12) United States Patent
Jang et al.

(10) Patent No.: US 7,687,361 B2
(45) Date of Patent: Mar. 30, 2010

(54) METHOD OF FABRICATING A TRANSISTOR HAVING A TRIPLE CHANNEL IN A MEMORY DEVICE

(75) Inventors: Se Aug Jang, Kyoungki-do (KR); Yong Soo Kim, Kyoungki-do (KR); Jae Geun Oh, Kyoungki-do (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 0 days.

(21) Appl. No.: 11/155,833

(22) Filed: Jun. 17, 2005

(65) Prior Publication Data

US 2006/0246671 A1 Nov. 2, 2006

(30) Foreign Application Priority Data

May 2, 2005 (KR) ............... 10-2005-0036794

(51) Int. Cl.
H01L 21/336 (2006.01)
(52) U.S. Cl. ............... 438/294; 438/296; 438/424; 257/E27.075; 257/E27.084; 257/E27.098; 257/E27.102; 257/E29.17; 257/E21.613
(58) Field of Classification Search ......... 438/294, 438/296, 424, FOR. 221, FOR. 227, 211, 438/257, 593, 638, FOR. 212; 257/E27.075, 257/E27.084, E27.098, E27.102, E29.17, 257/E21.613
See application file for complete search history.

(56) References Cited

U.S. PATENT DOCUMENTS 5,796,141 A 8/1998 Lin et al.
6,146,970 A * 11/2000 Witek et al. ............. 438/424
6,620,681 B1 * 9/2003 Kim et al. ............... 438/257
6,624,464 B2 * 9/2003 Shin et al. ............... 257/314
6,649,481 B2 * 11/2003 Wu ........................ 438/301
6,767,813 B2 * 7/2004 Lee et al. ................ 438/585
2002/0102793 A1 * 8/2002 Wu ........................ 438/257
2003/0096477 A1 * 5/2003 Bez et al. ................ 438/257
2004/0262676 A1 12/2004 Lee et al.
2005/0085042 A1 * 4/2005 Chun et al. ............. 438/275
2006/0088967 A1 * 4/2006 Hsiao et al. ............ 438/296

FOREIGN PATENT DOCUMENTS

CN 1855539 A 11/2006
JP 05226466 A * 9/1993
KR 2001-0014813 A 2/2001

* cited by examiner

Primary Examiner—Michelle Estrada
(74) Attorney, Agent, or Firm—Ladas & Parry LLP

(57) ABSTRACT

Disclosed is a method for fabricating a transistor of a memory device capable of preventing voids from being created when forming a low-resistant gate electrode. The method includes the steps of forming an active area by etching a semiconductor substrate, forming a field oxide layer in the semiconductor substrate and forming a recess by etching the field oxide layer. A gate insulation layer is formed along an upper surface of the active area and an exposed portion of the active area. A gate electrode is formed on the field oxide layer such that the gate electrode extends across an upper portion of the active area while being overlapped with a channel area and the recess. The first conductive layer to be patterned has the same thickness, so the low-resistant gate electrode is easily fabricated without forming the voids.

15 Claims, 17 Drawing Sheets

METHOD OF FABRICATING A TRANSISTOR HAVING A TRIPLE CHANNEL IN A MEMORY DEVICE

BACKGROUND OF THE INVENTION

1. Field of the Invention

The present invention relates to a method of fabricating a semiconductor device. More particularly, the present invention relates to a method of fabricating a transistor having a triple channel in a memory device.

2. Description of the Prior Art

Recently, as semiconductor devices have been highly integrated, channel lengths and channel widths of a transistor are significantly shortened. As the semiconductor devices are equipped with a short channel structure, the threshold voltage exerts a serious influence on the channel width. Accordingly, the conventional two-dimensional planar channel structure presents limitations to obtain the target threshold voltage of the transistor required for a specific semiconductor device.

In order to solve the above problem, studies and researches have been actively performed in relation to a three-dimensional transistor for applications in a logic device. In particular, a fin transistor having a triple channel feature has been recently spotlighted as potentially the next-generation nano scale transistor.

Since three surfaces of the triple channel structure of the fin transistor are used as channels, the fin transistor provides the superior ON-OFF characteristics and the superior current drivability, while lowering the back bias dependency of the threshold voltage. For this reason, studies and researches for applying the fin transistor to the logic device have been actively carried out.

FIGS. 1A to 1E are drawn to illustrate the procedure for fabricating a conventional fin transistor.

As shown in FIG. 1A, a trench is formed in an isolation layer of a semiconductor substrate 1 in such a manner that an active area 1a vertically protrudes from a predetermined portion of the semiconductor substrate 1. In addition, a field oxide layer 2 is formed in the trench.

Then, as shown in FIG. 1B, the field oxide layer 2 is etched by a predetermined thickness through a wet etching process and a dry etching process, thereby exposing the sides of the upper portion of the active area 1a.

After that, as shown in FIG. 1C, a gate insulation layer 3 is formed on the exposed upper portion of the active area 1a.

Then, as shown in FIG. 1D, a first conductive layer 4a of polysilicon and a second conductive layer 4b of a low-resistant material are sequentially deposited on the gate insulation layer 3 and the field oxide layer 2. The second conductive layer 4b includes WSix or W.

After that, as shown in FIG. 1E, predetermined portions of the first and second conductive layers 4a and 4b are sequentially etched, thereby forming a low-resistant gate electrode 4 having a stacked structure of the first and second conductive layers 4a and 4b and extending across the gate insulation layer 3 on the upper portion of the active area 1a while overlapping the channel area. Herein, reference characters S and D represent a source area and a drain area of the fin transistor, respectively.

However, if the fin transistor is fabricated by the above processes, a void V as shown in FIG. 1E may be formed in an "I" section of the low-resistant gate electrode 4 when forming the second conductive layer 4b, because a step difference in height is present between the field oxide layer 2 and the active area 1a that vertically protrudes above the field oxide layer 2. All of these factors contribute to undesirable increase of resistance of the low-resistant gate electrode 4.

To solve the above problem, another conventional fin transistor has been suggested. FIGS. 2A to 2G illustrate a procedure for fabricating another conventional fin transistor.

As shown in FIG. 2A, a trench is formed in an isolation layer of a semiconductor substrate 1 in such a manner that an active area 1a vertically protrudes from a predetermined portion of the semiconductor substrate 1. In addition, a field oxide layer 2 is formed in the trench.

Then, as shown in FIG. 2B, the field oxide layer 2 is etched by a predetermined thickness through a wet etching process and a dry etching process, thereby exposing the sides of the upper portion of the active area 1a.

After that, as shown in FIG. 2C, a gate insulation layer 3 is formed on the exposed upper portion of the active area 1a.

Then, as shown in FIG. 2D, a first conductive layer 4a of polysilicon is deposited on the gate insulation layer 3 and the field oxide layer 2.

Thereafter, as shown in FIG. 2E, the first conductive layer 4a is planarized through a chemical mechanical polishing (CMP) process. As a result, the first conductive layer 4a would have the thickness of "t1" for the portion above the active area 1a and the thickness of "t1+α" for the portion above the field oxide layer 2. Because the first conductive layer 4a is planarized, the step difference existing between the active area 1a and the field oxide layer 2 can be disregarded. Therefore, formation of a void on the layers that are subsequently deposited on the planarized first conductive layer 4a (for example, a process for depositing a second conductive layer 4b as shown in FIG. 2F) is prevented.

As shown in FIG. 2F, the second conductive layer 4b made from a low-resistant material is deposited on the planarized first conductive layer 4a. The material for the second conductive layer 4b includes WSix or W.

After that, as shown in FIG. 2G, predetermined portions of the first and second conductive layers 4a and 4b are sequentially etched, thereby forming a low-resistant gate electrode 4 having a stacked structure of the first and second conductive layers 4a and 4b and extending across the gate insulation layer 3 on the upper portion of the active area 1a while overlapping the channel area. Herein, reference characters S and D represent a source area and a drain area of the fin transistor, respectively.

If the low-resistant gate electrode 4 is fabricated by depositing an upper layer on a lower layer planarized by the CMP process, it is possible to prevent a void being created in the low-resistant gate electrode 4, but it presents other process problems. That is, since the thickness (t1+α) of the first conductive layer 4a on the field oxide layer 2 is relatively larger than the thickness (t1) of the first conductive layer 4a on the active area 1a, the process for fabricating the low-resistant gate electrode 4 by etching the first and second conductive layers 4a and 4b is difficult, and would lead to lowering of the yield rate of the transistor.

SUMMARY OF THE INVENTION

Accordingly, the present invention has been made to solve the above-mentioned problems occurring in the prior art, and an object of the present invention is to provide a method for fabricating a transistor of a memory device, which can facilitate an etching process for conductive layers when forming a gate electrode while improving the yield rate of the transistors by forming a conductive layer made from polysilicon using a technique capable of minimizing a poly valley.

Another object of the present invention is to provide a method for fabricating a transistor of a memory device capable of preventing resistance of a gate electrode from being increased by preventing a void from being created in the gate electrode when depositing a second conductive layer made from a low-resistant material on a first conductive layer made from polysilicon.

In order to accomplish the above objects, according to one aspect of the present invention, there is provided a method for fabricating a transistor of a memory device, the method comprising the steps of: forming an active area protruding from a predetermined portion of a semiconductor substrate by etching the semiconductor substrate; forming a field oxide layer defining the active area in the semiconductor substrate; forming a recess by etching a predetermined portion of the field oxide layer through which a gate electrode passes; forming a gate insulation layer along an upper surface of the active area and an exposed portion of the active area; and forming the gate electrode on the field oxide layer including the gate insulation layer in such a manner that the gate electrode having a stacked structure of first and second conductive layers extends across an upper portion of the active area while being overlapped with a channel area and the recess of the active area.

According to the preferred embodiment of the present invention, the field oxide layer has a thickness of about 2000 to 6000 Å. A depth of the recess is adjusted in such a manner that an oxide layer having a thickness corresponding to ½ of a thickness of the field oxide layer is formed on a bottom of the recess. The first conductive layer is made from polysilicon and the second conductive layer is made from a low-resistant material, which is one selective from the group consisting of W, WN, WSix and TiSix. The first conductive layer has a thickness of about 300 to 1500 Å.

According to another aspect of the present invention, there is provided a method for fabricating a transistor of a memory device, the method comprising the steps of: forming an active area protruding from a predetermined portion of a semiconductor substrate by etching the semiconductor substrate; forming a field oxide layer defining the active area in the semiconductor substrate; forming a first recess in a channel area provided in the active area; forming a second recess by etching a predetermined portion of the field oxide layer, through which a gate electrode passes, in such a manner that the second recess has a depth larger than a depth of the first recess; forming a gate insulation layer along an upper surface of the active area and an exposed portion of the active area, which is exposed to an exterior through the first and second recesses; and forming a gate electrode on the field oxide layer including the gate insulation layer in such a manner that the gate electrode having a stacked structure of first and second conductive layers extends across an upper portion of the active area while being overlapped with the first and second recesses.

According to the preferred embodiment of the present invention, the field oxide layer has a thickness of about 2000 to 6000 Å. The depth of the first recess corresponds to ⅓ of a thickness of the field oxide layer. The depth of the second recess is adjusted in such a manner that the field oxide layer having a thickness corresponding ⅓~½ of the thickness of the field oxide layer remains on the bottom of the second recess. The step of forming the first recess is interchangeable with the step of forming the second recess. The first conductive layer is made from polysilicon and the second conductive layer is made from a low-resistant material, which is one selective from the group consisting of W, WN, WSix and TiSix. The first conductive layer has a thickness of about 300 to 1500 Å.

If the transistor is fabricated through the above process, the predetermined portion of the field oxide layer is selectively etched so as to allow the gate electrode to pass therethrough. Therefore, the first conductive layer to be patterned may have the same thickness, so that the void cannot be formed when depositing the second conductive layer made from the low-resistant material on the first conductive layer. In addition, the low-resistant gate electrode can be easily fabricated by etching the first and second conductive layers.

BRIEF DESCRIPTION OF THE DRAWINGS

The above and other objects, features and advantages of the present invention will be more apparent from the following detailed description taken in conjunction with the accompanying drawings, in which:

FIGS. 5A and 5B shows the structure of a transistor fabricated through a process according to the first embodiment of the present invention, wherein FIG. 5A is a cross-sectional view taken along line A-A' shown in FIG. 4F; and FIG. 5B is a cross-sectional view taken along line B-B' shown in FIG. 4F;

FIGS. 7A to 7D shows the structure of a transistor fabricated through the process according to the second embodiment of the present invention, wherein FIG. 7A is a cross-sectional view taken along line A-A' shown in FIG. 6G; FIG. 7B is a cross-sectional view taken along line A1-A1' shown in FIG. 6G; FIG. 7C is a cross-sectional view taken along line B-B' shown in FIG. 6G; and FIG. 7D is a cross-sectional view taken along line B1-B1' shown in FIG. 6G.

DETAILED DESCRIPTION OF THE PREFERRED EMBODIMENTS

Hereinafter, the present invention will be described with reference to accompanying drawings.

Figure 3A:
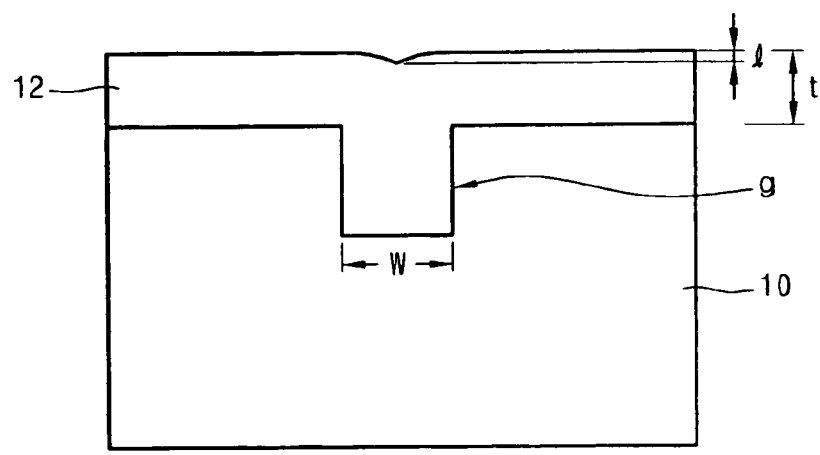
FIG. 3A is a cross-sectional view for illustrating a polysilicon layer deposited in a recess according to one embodiment of the present invention.
Figure 3B:
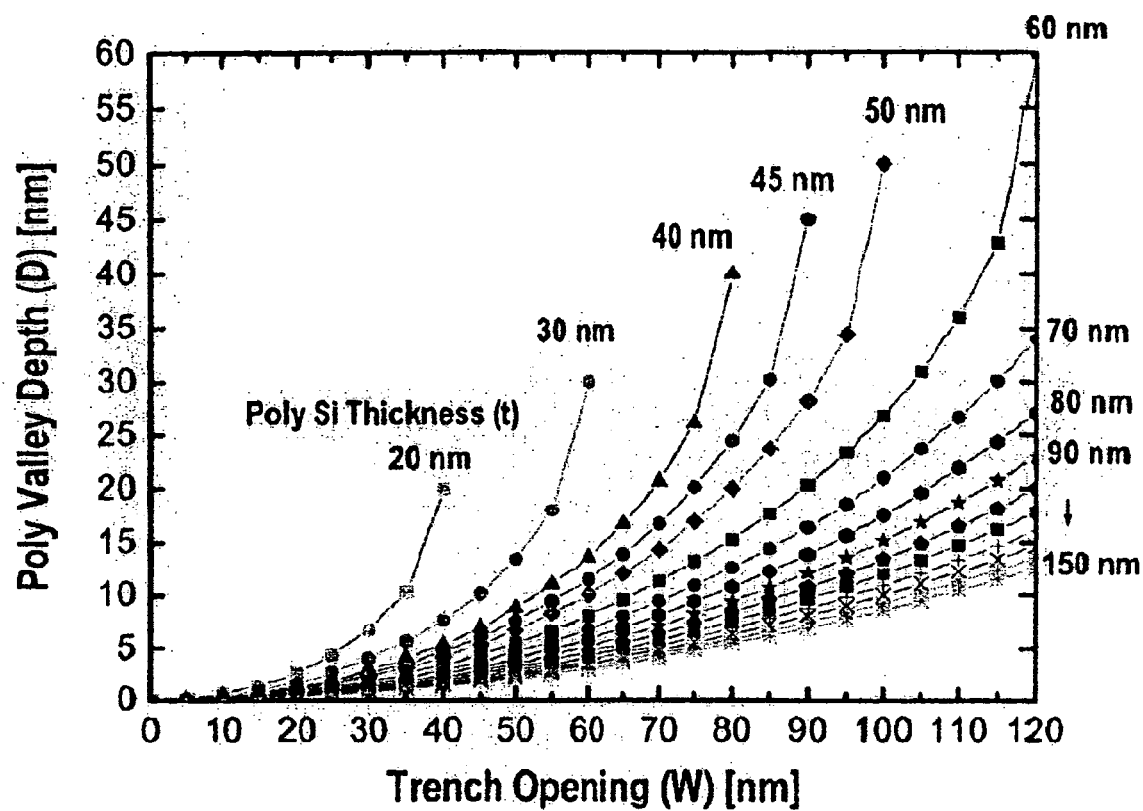
FIG. 3B is a graph illustrating the variation of a poly valley depth according to a deposition thickness of a polysilicon layer as shown in FIG. 3A.

FIGS. 3A and 3B are views shown for explaining a technical principle of the present invention, of which FIG. 3A is a sectional view for illustrating a polysilicon layer deposited in a recess according to one embodiment of the present invention, and FIG. 3B is a graph for illustrating variation of a poly valley depth Q according to varying deposition thicknesses of the polysilicon layer.

Referring to FIGS. 3A and 3B, the poly valley depth l of a polysilicon layer 12 decreases as the width W of a recess g is reduced and a deposition thickness t of the polysilicon layer 12 is enlarged, so that the recess g is easily filled with the polysilicon layer 12. That is, if the polysilicon layer 12 having the proper thickness selected according to FIG. 3B is deposited over the whole width W of the recess g, the recess g can be easily filled with the polysilicon layer 12 without taking the poly valley into consideration. In FIG. 3A, reference numeral 10 represents a semiconductor substrate.

The following description will be made in relation to a method for fabricating the transistor of the memory according to first and second embodiments of the present invention.

FIGS. 4A to 4F are perspective views for illustrating the procedure for fabricating the transistor of the memory device according to the first embodiment of the present invention. Hereinafter, a method of fabricating the transistor of the memory device according to the first embodiment of the present invention will be described in detail with reference to FIGS. 4A to 4F.

Figure 4A:
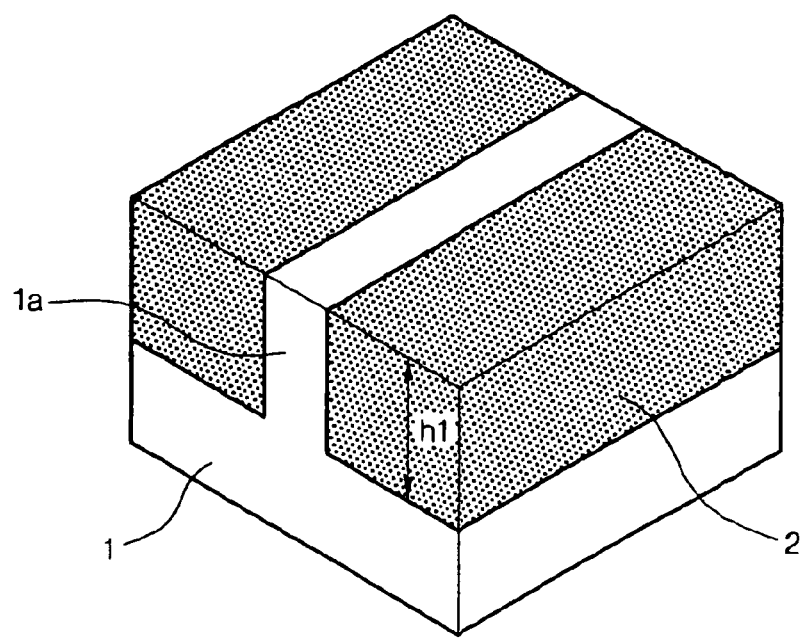
FIGS. 4A to 4F are perspective views for illustrating the fabricating procedure of a transistor of a memory device according to the first embodiment of the present invention.

First, as shown in FIG. 4A, the semiconductor substrate 1 is etched to form an active area 1a, and consequently a trench is formed on either side of the vertically protruding active area 1a. The etched portions formed on either side of the active area 1a, which is the trench, is an isolation area. A field oxide layer 2 having a thickness h1 in a range of about 2000 to 6000 Å is formed in the trench or the isolation area.

Figure 4B:
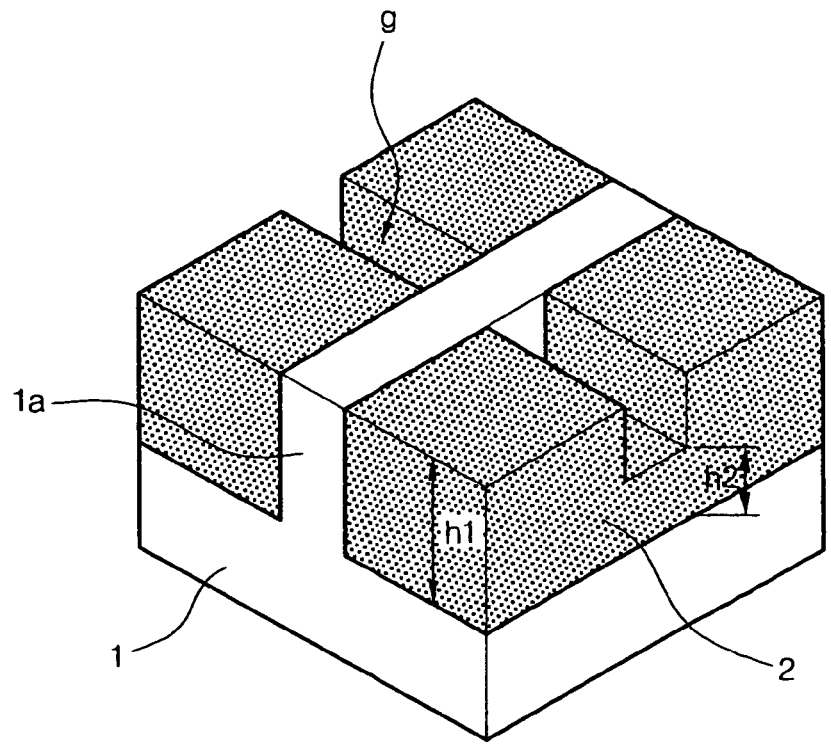

Then, as shown in FIG. 4B, a recess g is formed in a straight line on either side of the active area 1a by etching the predetermined portions of the field oxide layer 2. A gate electrode (such as 4 shown in FIG. 4F) can then be formed utilizing the recess g. The portions of the field oxide layer below the recess g have the reduced thickness h2 that is smaller than the depth h1 of the field oxide layer 2. Preferably, the reduced thickness h2 is half the thickness h1 of the field oxide layer 2. For example, if the thickness h1 of the field oxide layer 2 is 3000 Å, the reduced thickness h2 in the field oxide layer 2 below the recess g is preferably 1500 Å. However, the thickness h2 of the field oxide layer 2 can be variously adjusted without departing the inventive concepts according to various embodiments of the present invention.

Figure 4C:
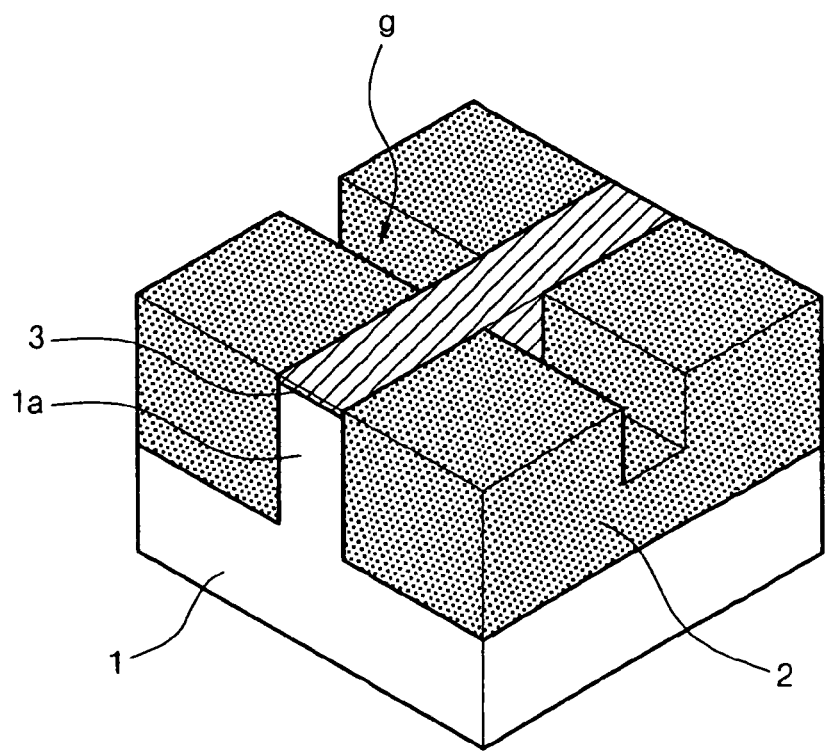

After that, as shown in FIG. 4C, a gate insulation layer 3 is formed on the upper surface of the active area 1a and on the portions of the active area 1a exposed by the recess g.

Figure 4D:
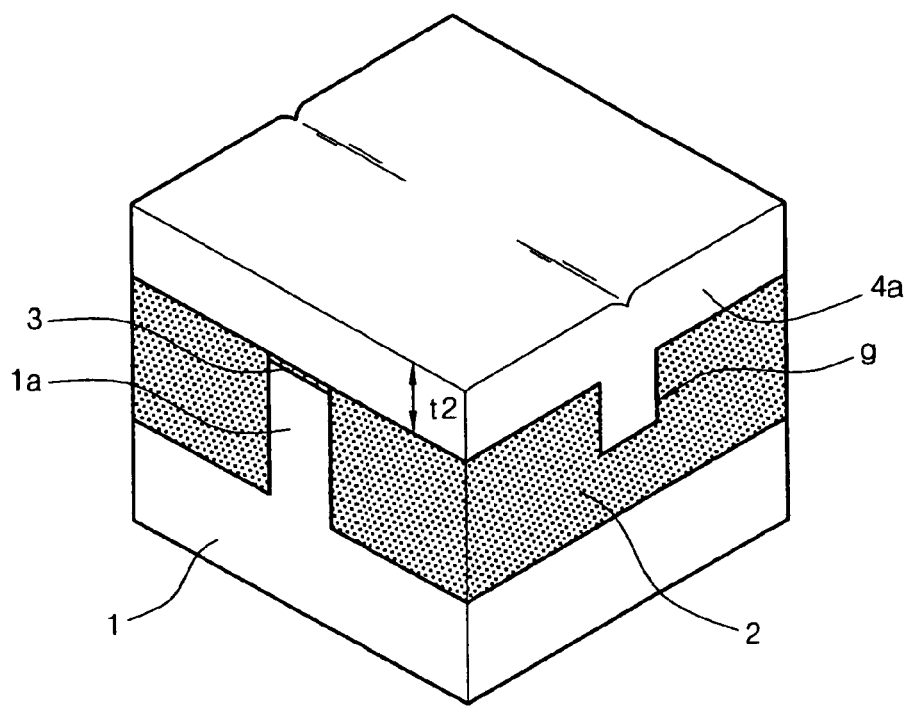

Then, as shown in FIG. 4D, a first conductive layer 4a made from polysilicon of thickness in the range of about 300 to 1500 Å is formed on the field oxide layer 2 including the recess g and the gate insulation layer 3. A poly valley may be formed along the recessed portion g. However, as already mentioned with reference to FIGS. 3A and 3B, it is not necessary to take the poly valley into consideration since the poly valley depth can be minimized by means of the polysilicon layer having a proper thickness. Accordingly, the first conductive layer 4a of thickness t2 is formed on the active area 1a and on the field oxide layer 2 excluding the portions formed with the recess g.

Figure 4E:
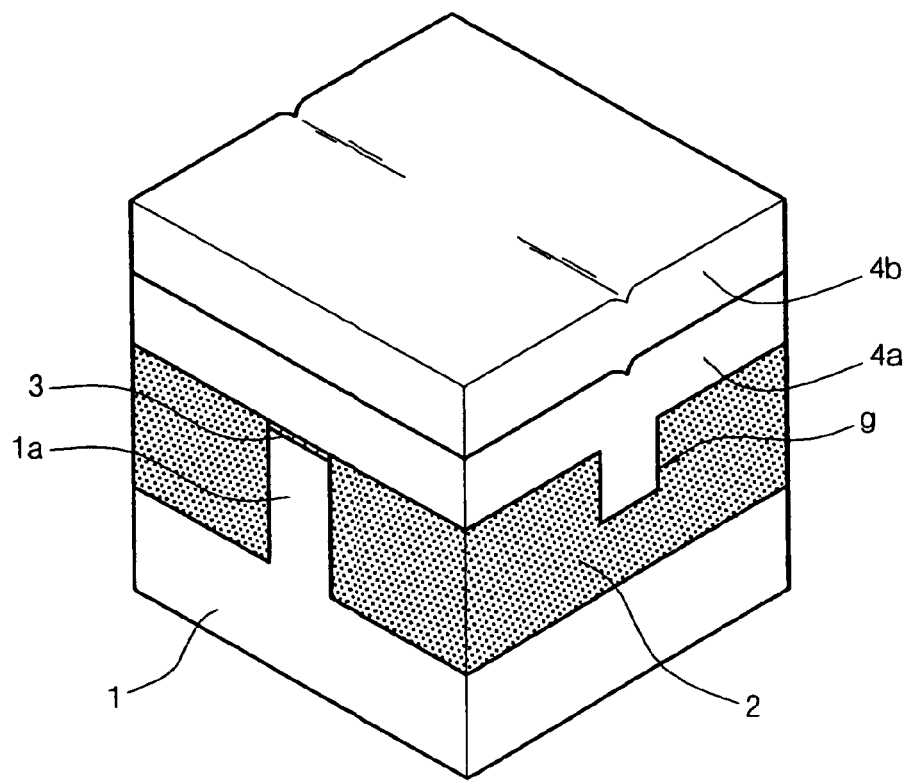

Then, as shown in FIG. 4E, a second conductive layer 4b made from a low-resistant material is formed on the first conductive layer 4a. At this time, the conductive layer 4b includes W, WN, WSix or TiSix and is deposited on the first conductive layer 4a through a chemical vapor deposition (CVD) process or a physical vapor deposition (PVD) process.

Figure 4F:
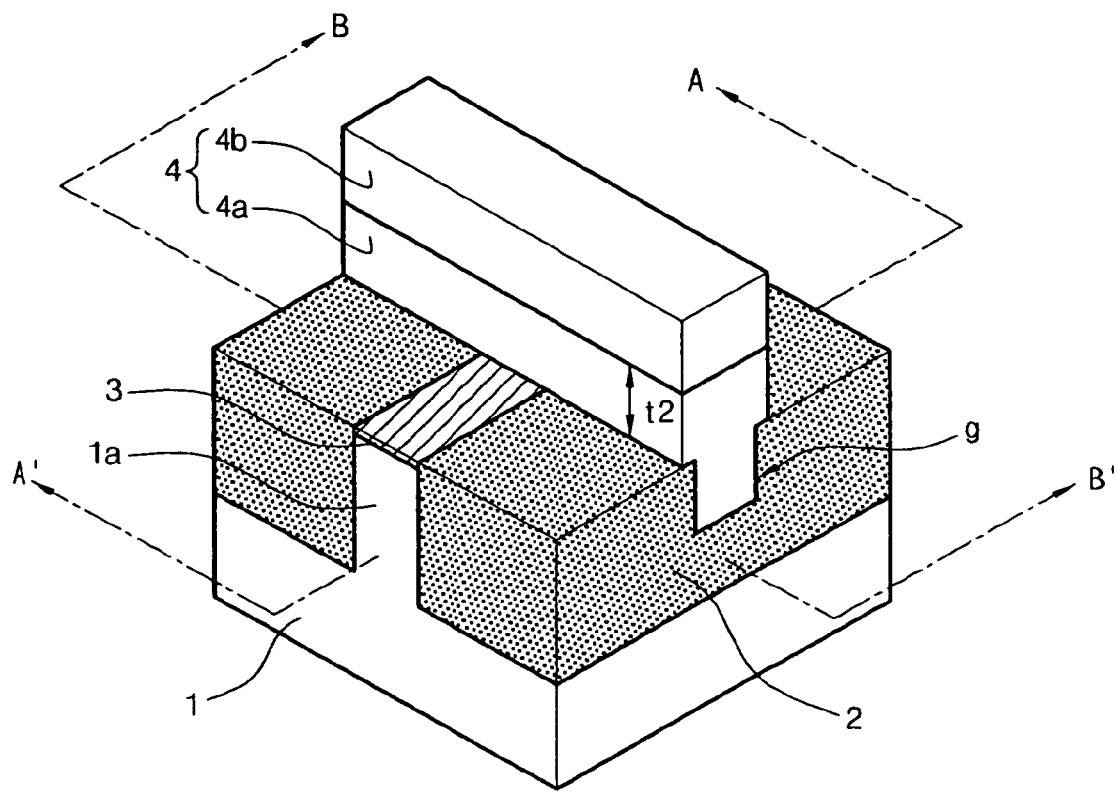

After that, as shown in FIG. 4F, predetermined portions of the first and second conductive layers 4a and 4b (outside the portions of the layers 4a and 4b formed in and along the recess g) are sequentially etched to form a low-resistant gate electrode 4 that crosses the upper portion of the active area 1a in an overlapping manner. The low-resistant gate electrode 4 has a stacked structure of the first and second conductive layers 4a and 4b. A source area S and a drain area D are formed in the active area 1a at both sides of the low-resistant gate electrode 4 through an ion implantation process.

Figure 5A:
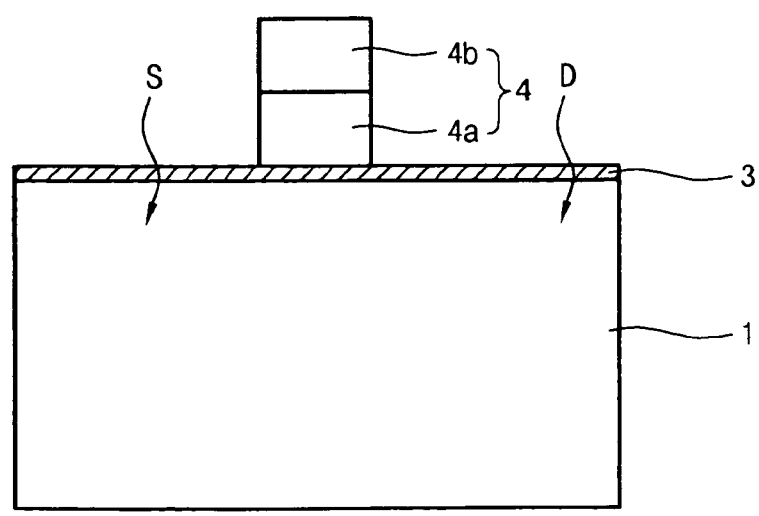
Figure 5B:
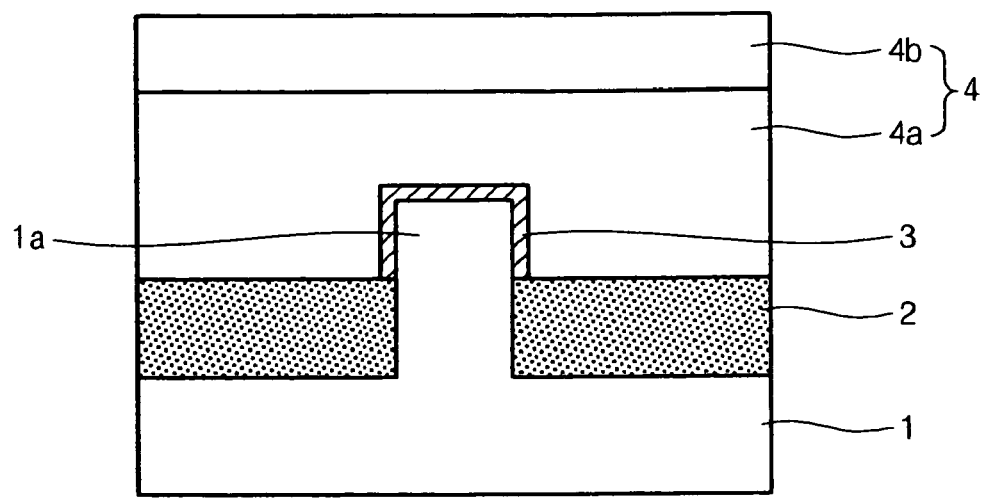

FIGS. 5A and 5B illustrate the structure of the transistor fabricated by the process according to the first embodiment of the present invention, wherein FIG. 5A is a cross-sectional view taken along line A-A' shown in FIG. 4F, and FIG. 5B is a cross-sectional view taken along line B-B' shown in FIG. 4F.

It can be understood from FIGS. 5A and 5B that the transistor according to the first embodiment of the present invention has the following structure. That is, the transistor includes the active area 1a vertically protruding from the predetermined portion of the semiconductor substrate 1 and the field oxide layer 2 is formed at both sides of the active area 1a. In addition, the recess g integrally formed with the channel area provided in the active area 1a is formed in the field oxide layer 2 in such a manner that the gate electrode passes through the recess g. The low-resistant gate electrode 4, which extends through the upper portion of the active area 1a while being overlapped with the channel area and the recess g of the active area 1a, is formed on the field oxide layer 2. In addition, the gate insulation layer 3 is interposed between the low-resistant gate electrode 4 and the active area 1a. The source and drain areas S and D are formed on the active area 1a at both sides of the gate electrode 4.

Figure 1A:
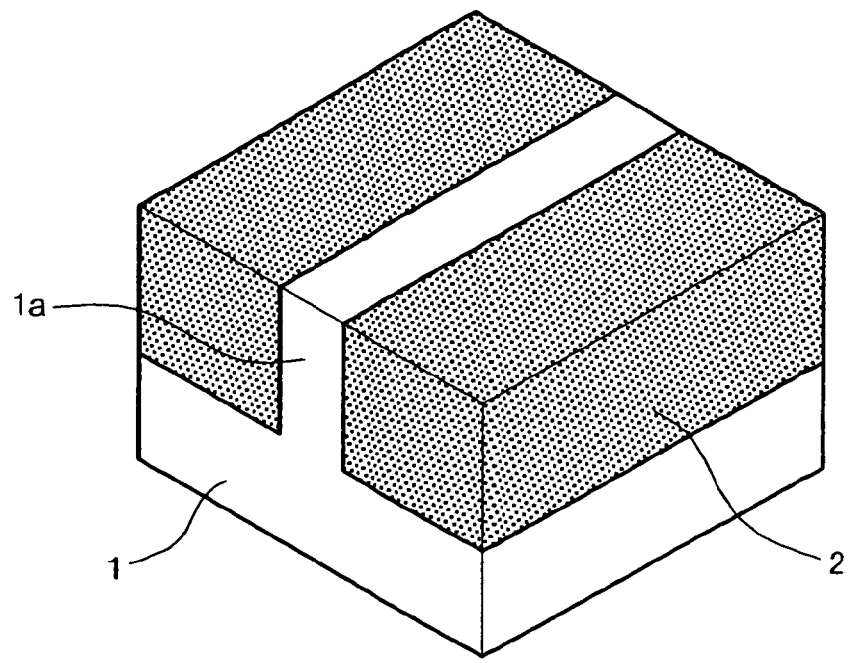
FIGS. 1A to 1E are perspective views for illustrating a conventional method for fabricating a fin transistor.
Figure 1B:
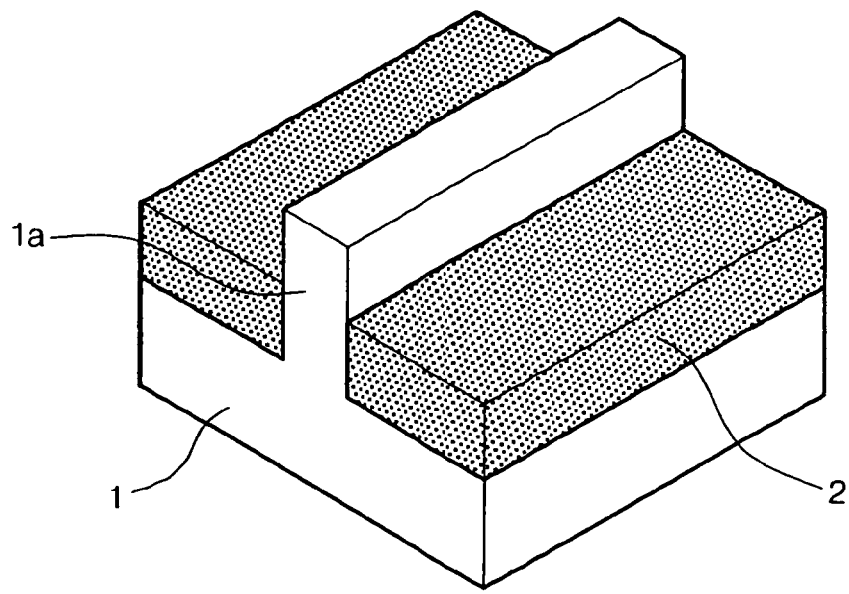
Figure 1C:
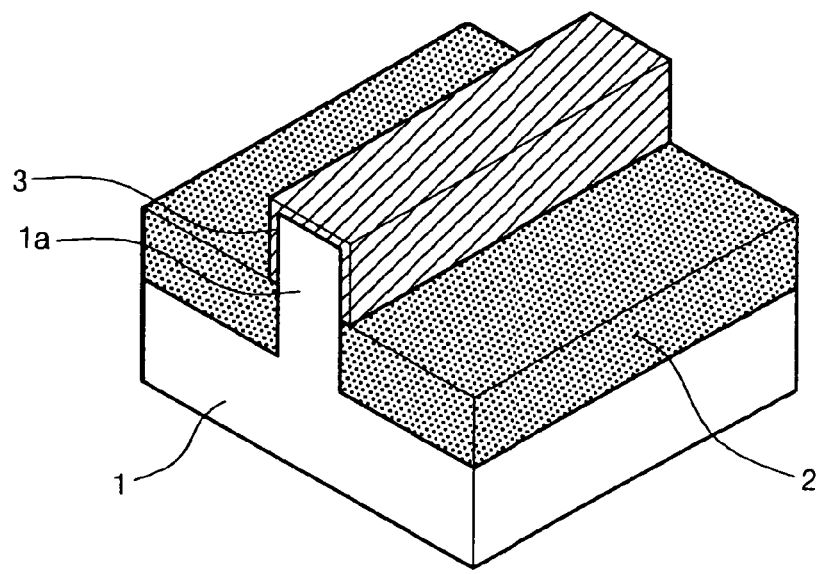
Figure 1D:
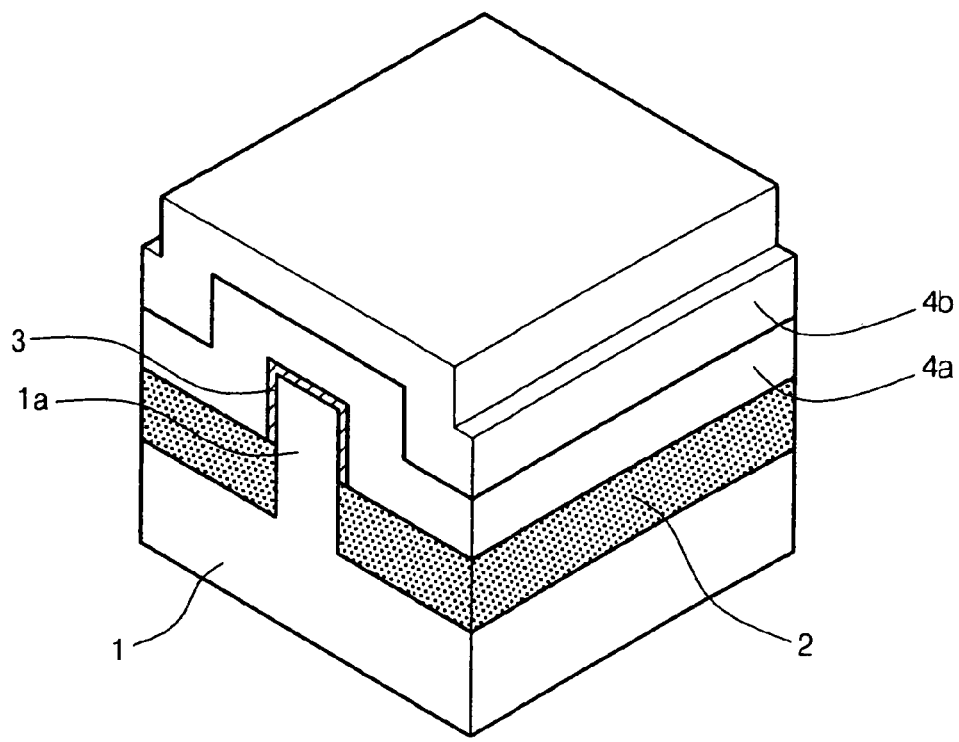
Figure 1E:
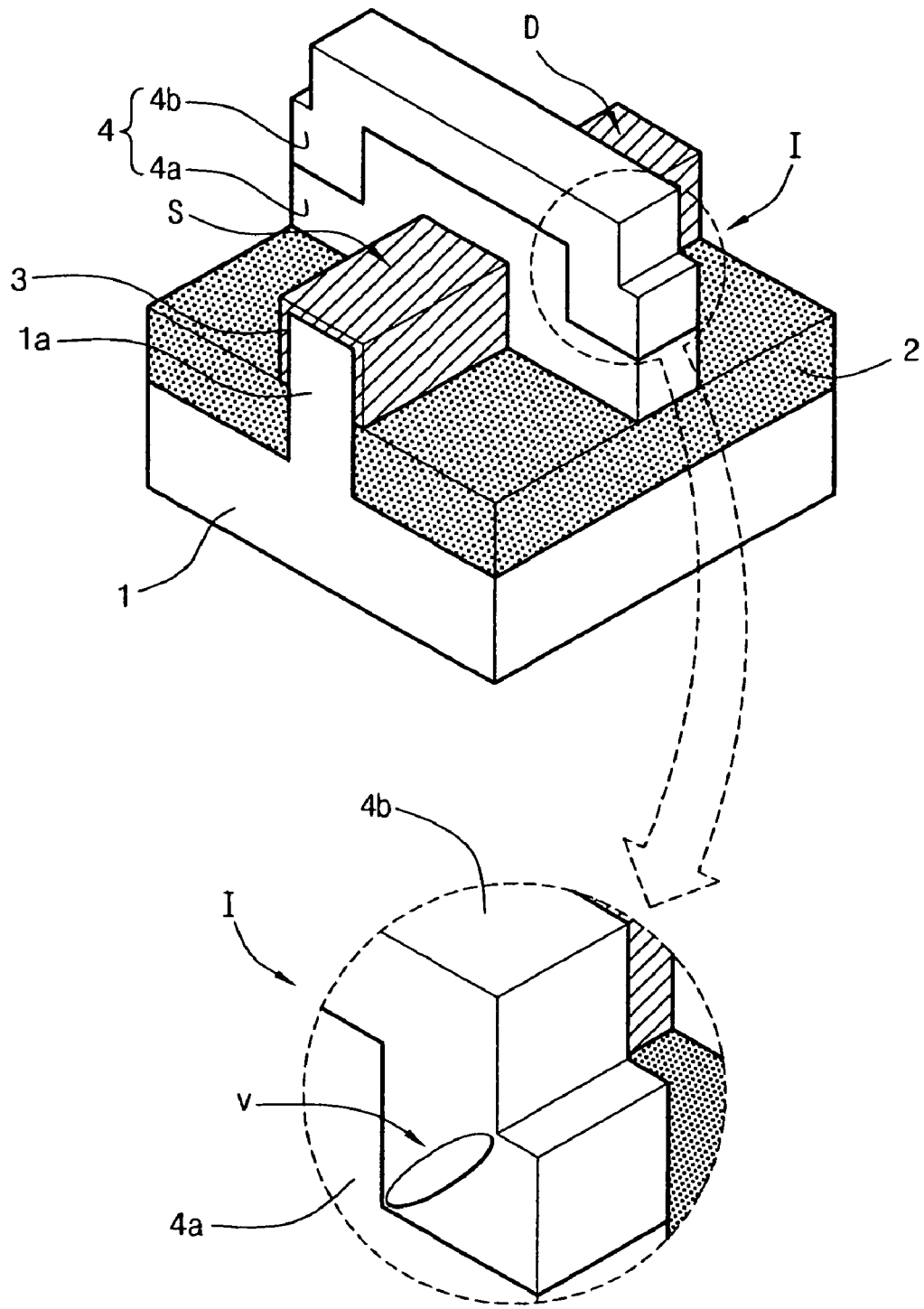
Figure 2A:
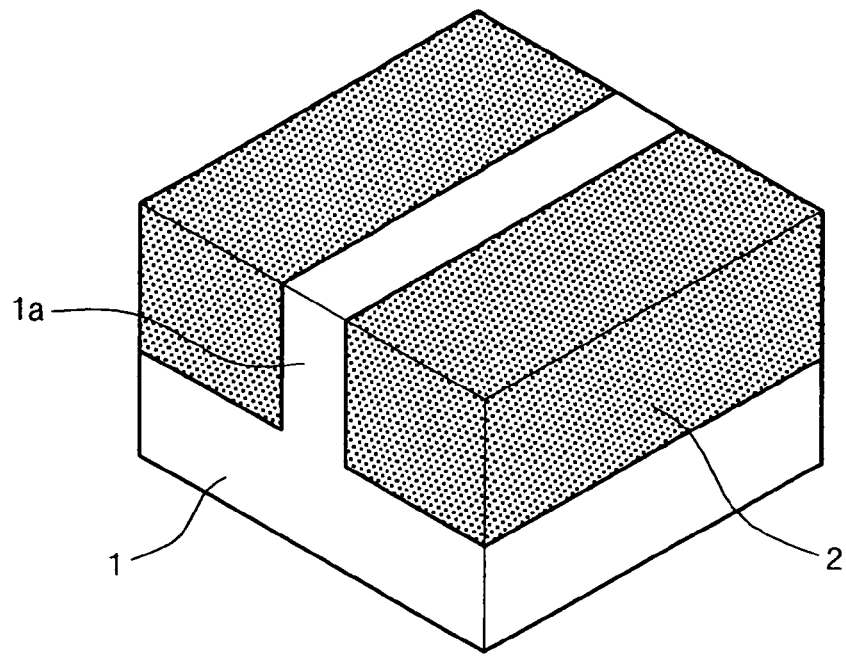
FIGS. 2A to 2G are perspective views for illustrating another conventional method for fabricating a fin transistor.
Figure 2B:
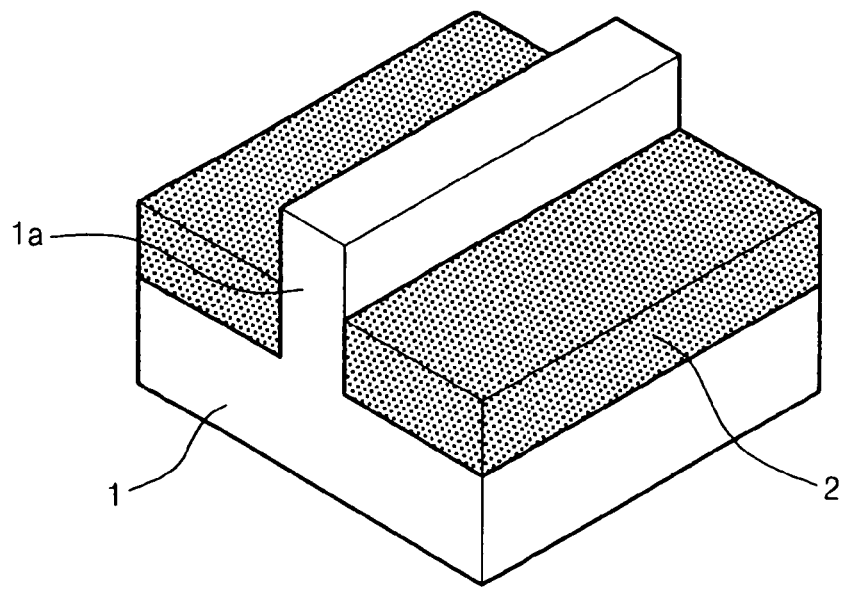
Figure 2C:
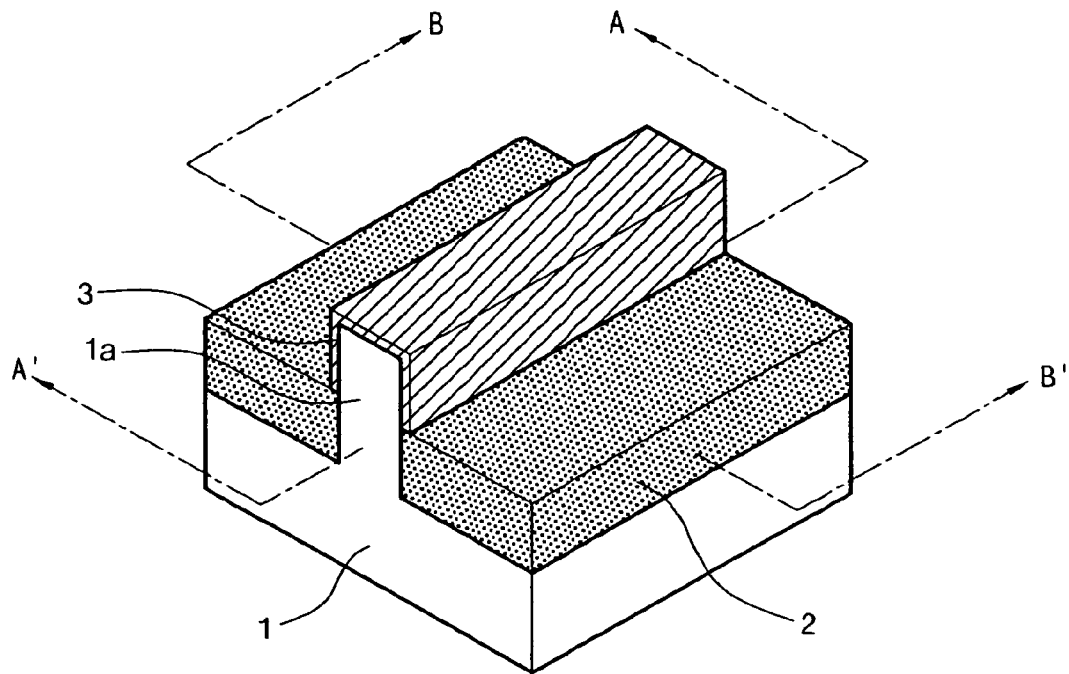
Figure 2D:
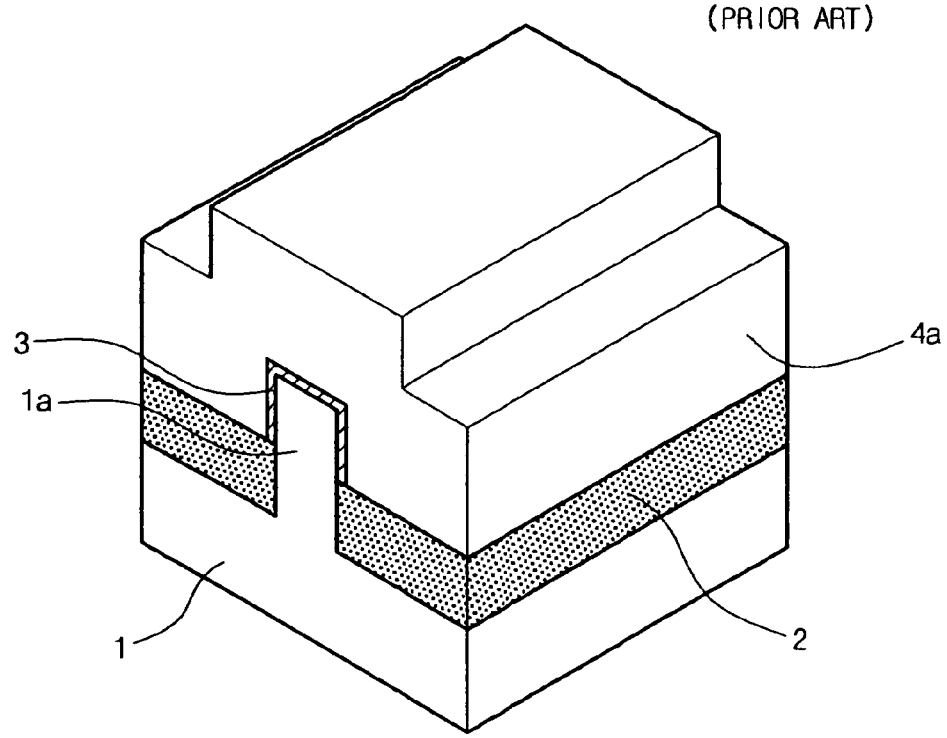
Figure 2E:
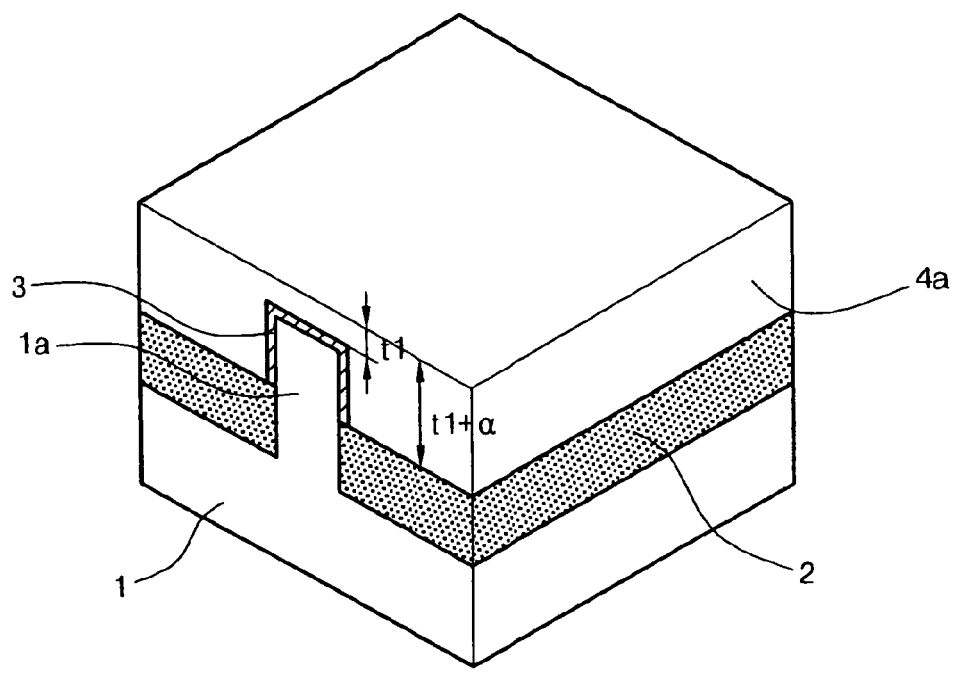
Figure 2F:
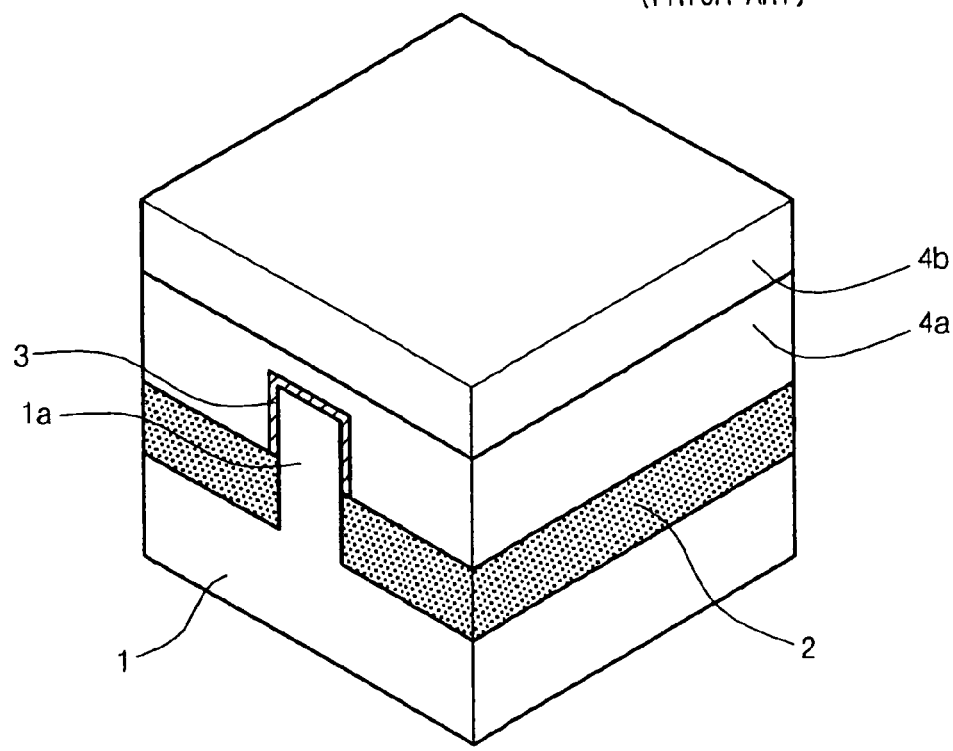
Figure 2G:
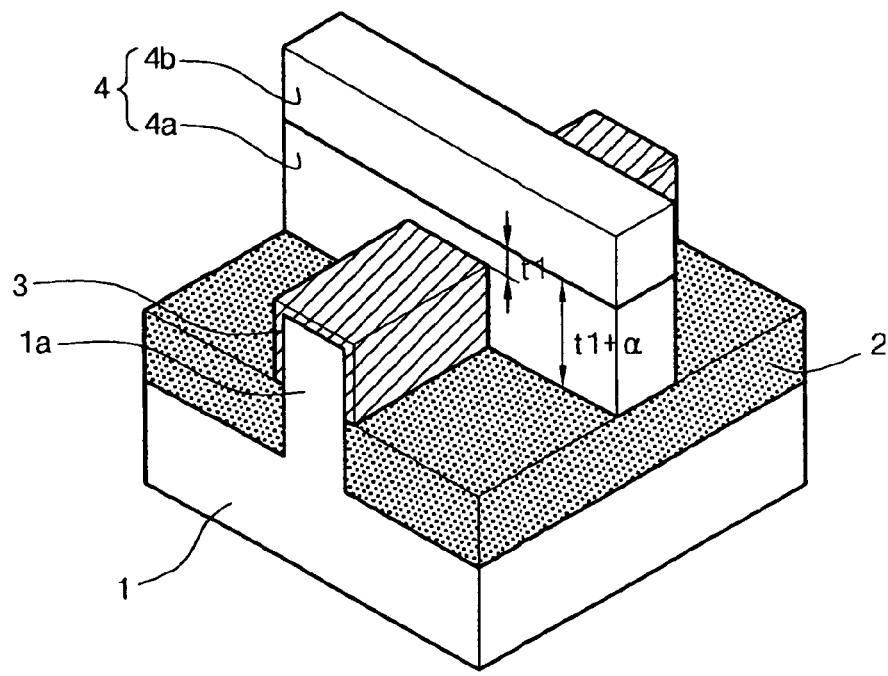

If the transistor is fabricated through the above process, the first conductive layer 4a to be patterned can be formed with the same thickness t2, so that the low-resistant gate electrode 4 can be easily fabricated by etching the first and second conductive layers 4a and 4b. This solves the prior art problem as depicted in FIG. 2G that requires etching of the electrode 4a of FIG. 2G through two different heights "t1" and "t1+α".

Further, the void is prevented from being created when fabricating the low-resistant gate electrode 4, since there is no step difference in height between the active area 1a and the field oxide layer 2, which allows the formation of first conductive layer 4a having the uniform thickness t2 on the active area 1a.

FIGS. 6A to 6G are perspective views drawn to illustrate the transistor fabricating procedures in a memory device according to a second embodiment of the present invention. Hereinafter, a method for fabricating the transistor of the memory device according to the second embodiment of the present invention will be described in detail with reference to FIGS. 6A to 6G.

Figure 6A:
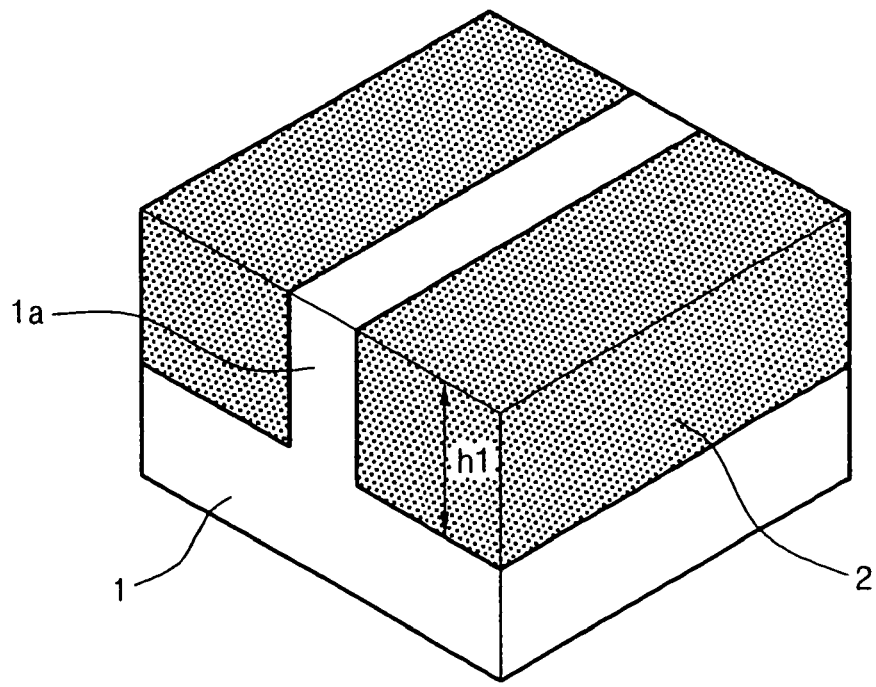
FIGS. 6A to 6G are perspective views illustrating the fabricating procedure of a transistor of a memory device according to the second embodiment of the present invention.

First, as shown in FIG. 6A, a trench is formed in an isolation layer of a semiconductor substrate 1 by etching a predetermined portion of the semiconductor substrate 1. As a result, an active area 1a vertically protrudes from a predetermined portion of the semiconductor substrate 1. The trench section is therefore an isolation area. After that, a field oxide layer 2 of thickness h1 in the range of about 2000 to 6000 Å is formed in the trench.

Figure 6B:
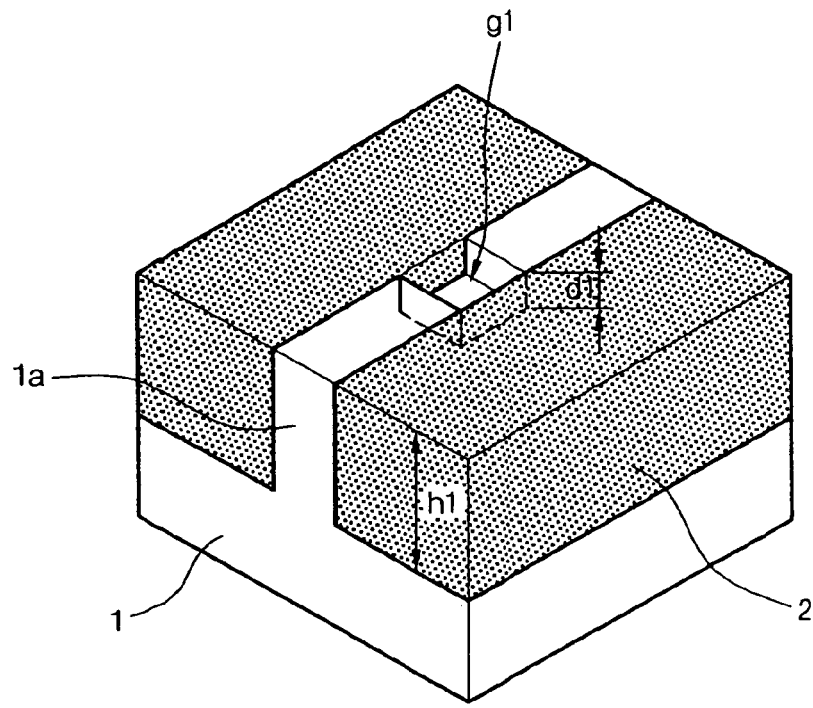

Then, as shown in FIG. 6B, a first recess g1 having a predetermined depth of d1 is formed in a channel area of the active area 1a. Preferably, the depth d1 of the first recess g1 is one-third of the thickness h1 of the field oxide layer 2. For example, if the thickness h1 of the field oxide layer 2 is 3000 Å, the depth d1 of the first recess g1 is preferably 1000 Å. However, the depth d1 of the first recess g1 can be variously adjusted without departing the inventive concepts according to various embodiments of the present invention.

Figure 6C:
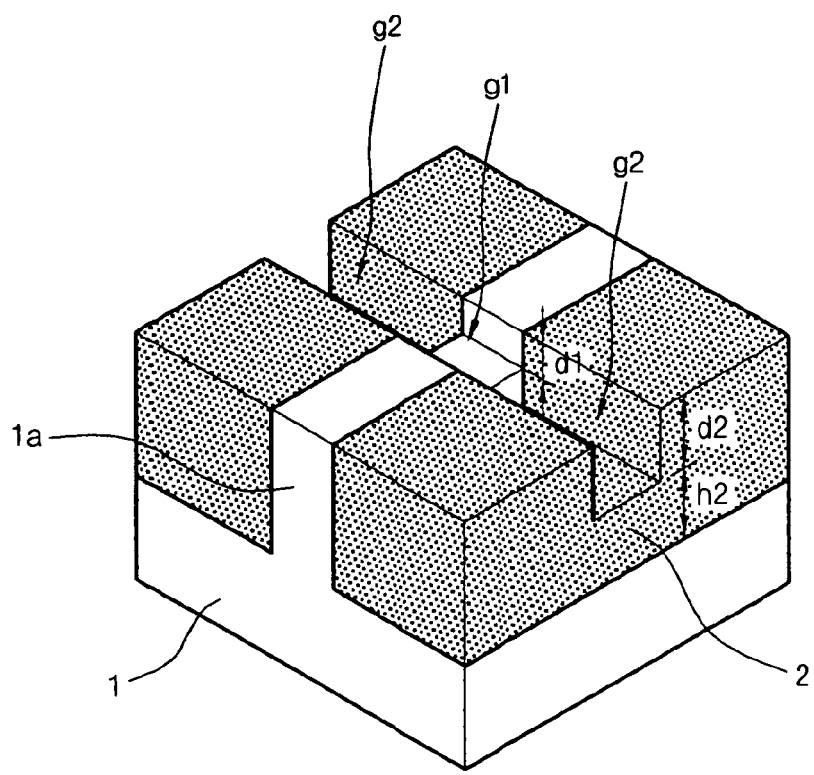

After that, as shown in FIG. 6C, a second recess g2 connected to the first recess g1 is formed by etching the predetermined portions of the field oxide layer 2. A gate electrode (such as 4 FIG. 6G) can then be formed in the recesses g1 and g2 crossing the active area 1a in an overlapping manner). The second recess g2 has a second recess depth d2, which is larger than the first recess depth d1. The thickness of the portions of the field oxide layer 2 below the recess g2 is h2. That is, the thickness h1 of the field oxide layer 2 is the sum of the thicknesses d2 and h2. Preferably, the thickness h2 of the field oxide layer 2 below the second recess g2 is one-third to one-half of the initial thickness h1 of the field oxide layer 2. For example, if the thickness h1 of the field oxide layer 2 is 3000 Å, the thickness h2 of the field oxide layer 2 below the bottom of the second recess g2 is set preferably to 1000 Å. However, the thickness h2 of the field oxide layer 2 can be variously adjusted without departing the inventive concepts according to various embodiments of the present invention. Since the second recess depth d2 of the second recess g2 is larger than the first recess depth d1 of the first recess g1, the channels can then be formed on the three surfaces of the transistor when the transistor is sectioned along the gate line.

According to yet another embodiment of the present invention, a process step of forming the first recess g1 shown in FIG. 6B is interchangeable with a process step of forming the second recess g2 shown in FIG. 6C. In addition, the first and second recesses g1 and g2 can be formed simultaneously by a photolithography process, for example, one time by utilizing the chemical having the sufficient etch selectivity between a silicon and an oxide.

Figure 6D:
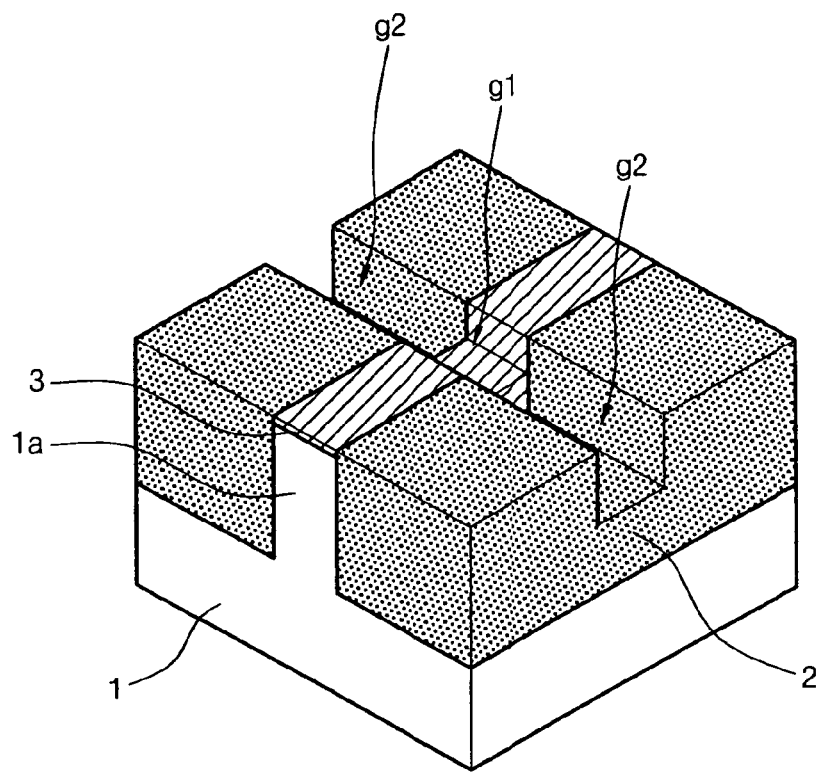

Referring now to FIG. 6D, a gate insulation layer 3 is formed on the upper surface of the active area 1a and the portions of the active area 1a that are exposed through the recesses g1 and g2.

Figure 6E:
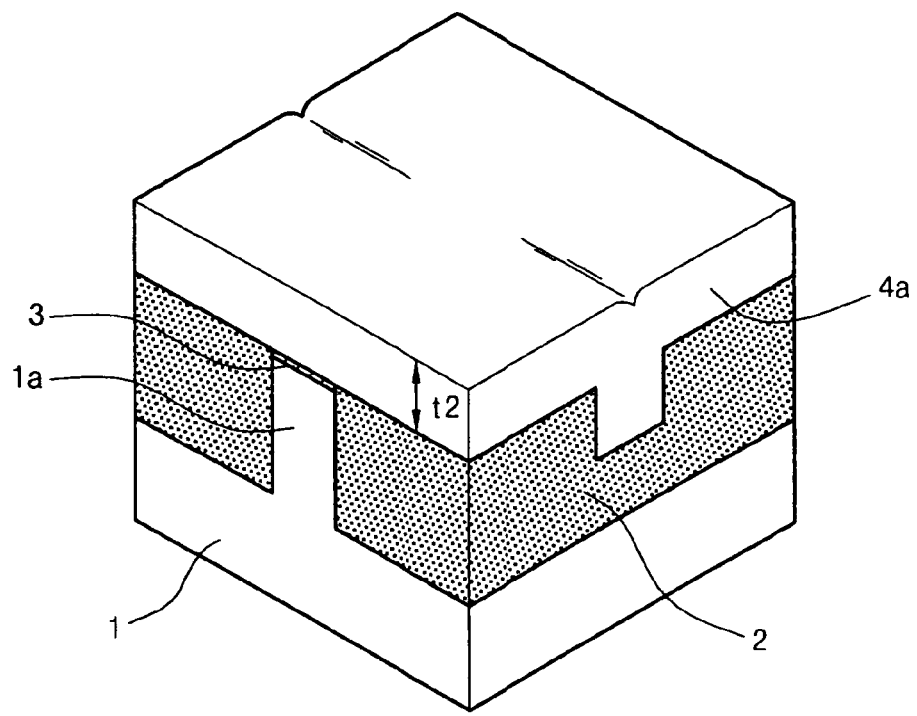

In addition, as shown in FIG. 6E, a first conductive layer 4a made from polysilicon of thickness in the range of about 300 to 1500 Å is formed on the field oxide layer 2 including the first and second recesses g1 and g2 and on the gate insulation layer 3. At this time, a poly valley can be formed along a recessed portion. However, as already mentioned with reference to FIGS. 3A and 3B, it is not necessary to take the poly valley into consideration since the poly valley depth can be minimized by means of the polysilicon layer having a proper thickness. Accordingly, the first conductive layer 4a of thickness t2 is formed on the active area 1a and the field oxide layer 2.

Figure 6F:
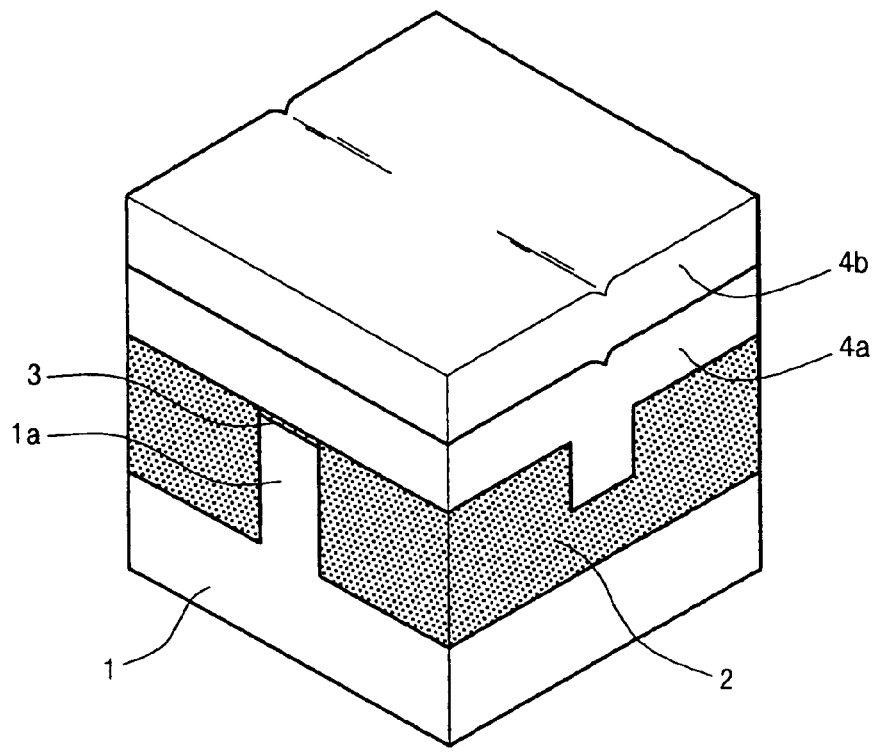

Then, as shown in FIG. 6F, a second conductive layer 4b made from a low-resistant material is formed on the first conductive layer 4a through the CVD process or the PVD process. At this time, the conductive layer 4b may include W, WN, WSix or TiSix.

Figure 6G:
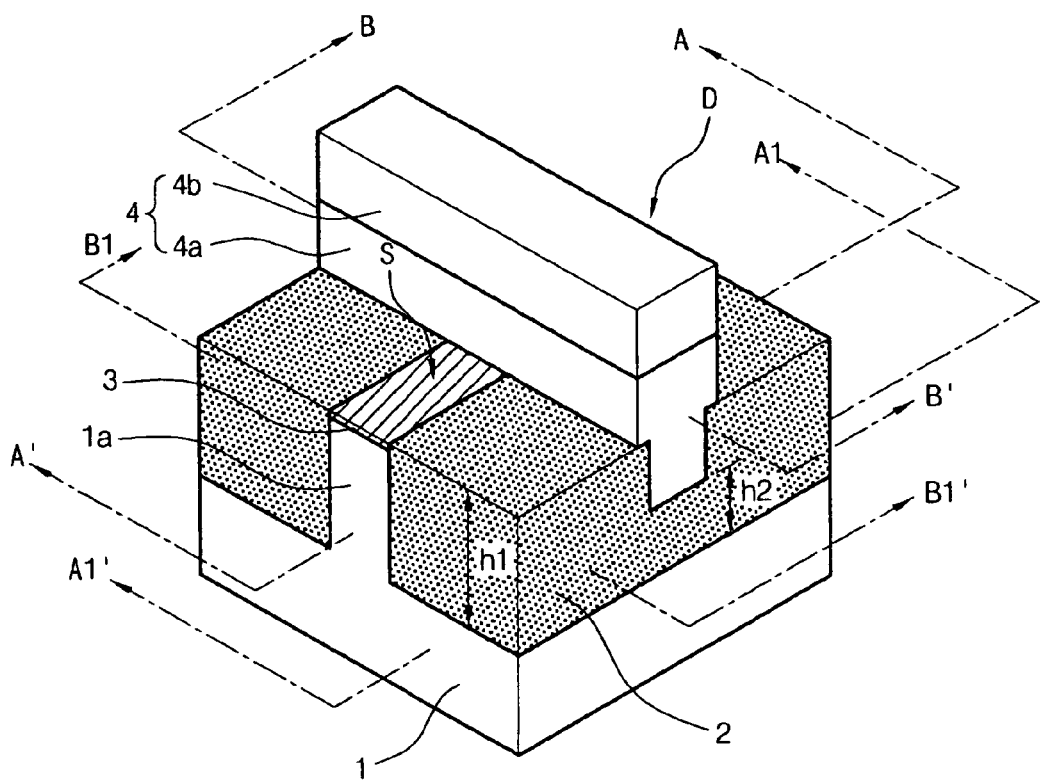

After that, as shown in FIG. 6G, predetermined portions of the first and second conductive layers 4a and 4b (i.e., the portions outside the layers 4a and 4b formed in and along the recess g) are sequentially etched to form a low-resistant gate electrode 4 that crosses the upper portion of the active area 1a in an overlapping manner. The low-resistant gate electrode 4 has a stacked structure of the first and second conductive layers 4a and 4b. A source area S and a drain area D are formed in the active area 1a at both sides of the low-resistant gate electrode 4 through an ion implantation process.

Figure 7A:
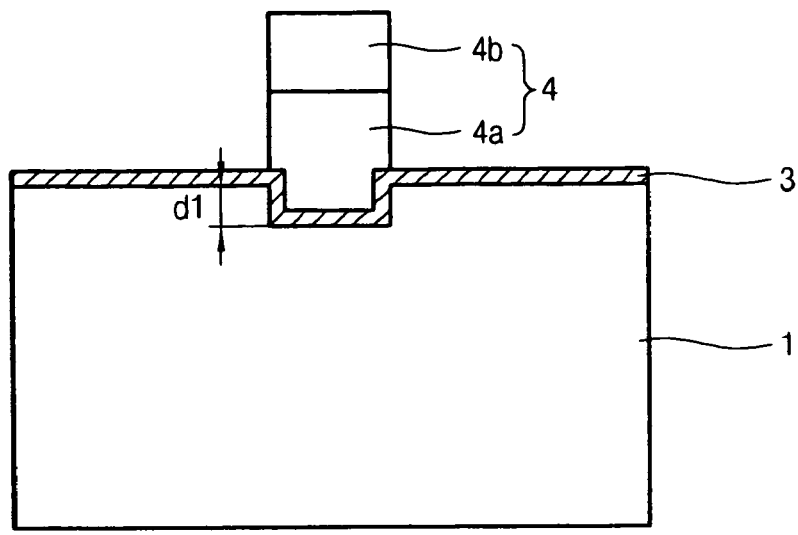
Figure 7B:
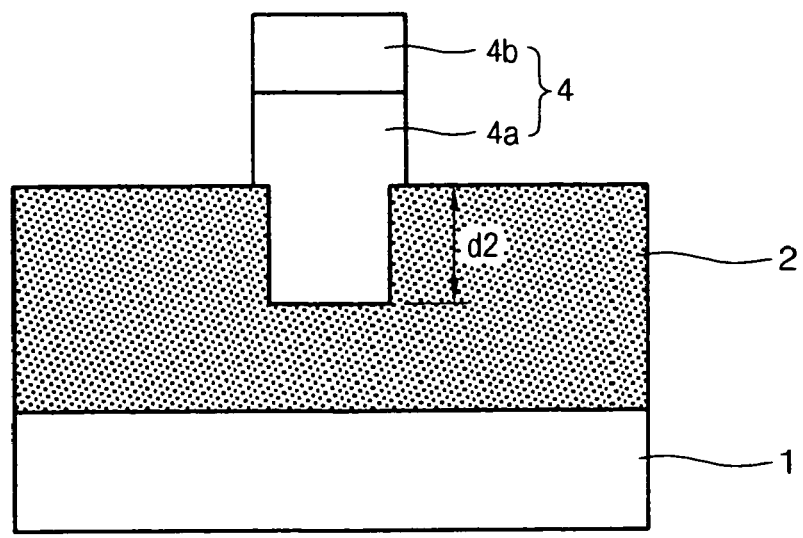
Figure 7C:
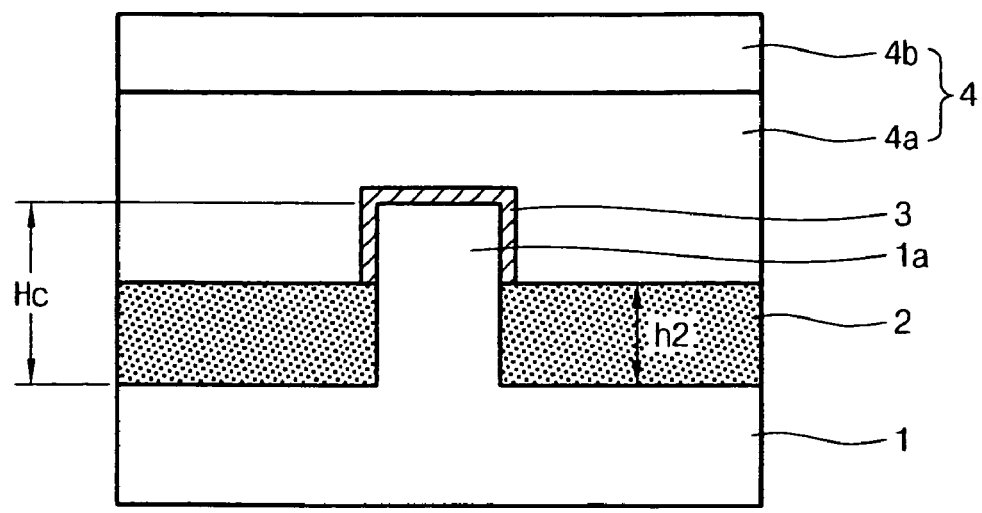
Figure 7D:
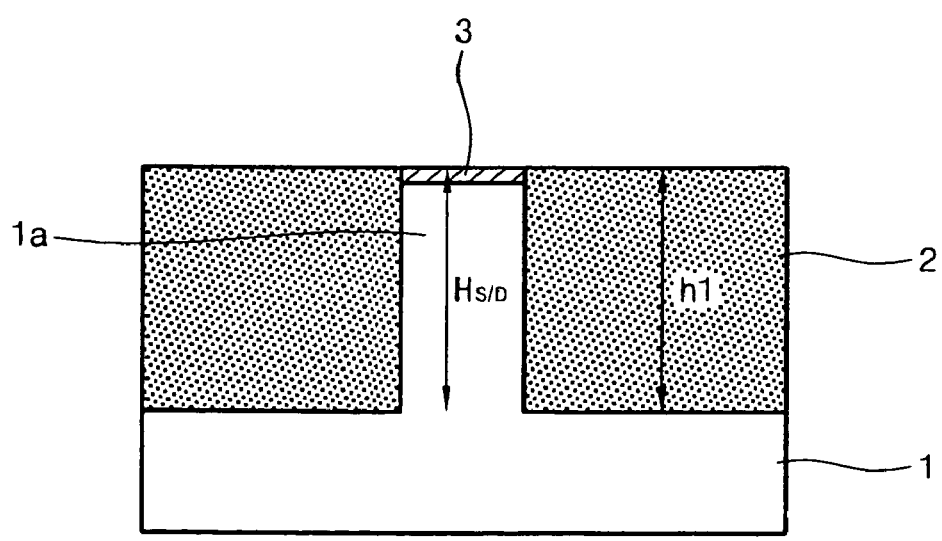

FIGS. 7A to 7D illustrate the structure of the transistor fabricated according to the second embodiment of the present invention, wherein FIG. 7A is a cross-sectional view taken along line A-A' shown in FIG. 6G; FIG. 7B is a cross-sectional view taken along line A1-A1' shown in FIG. 6G; FIG. 7C is a cross-sectional view taken along line B-B' shown in FIG. 6G; and FIG. 7D is a cross-sectional view taken along line B1-B1' shown in FIG. 6G.

It can be understood from FIGS. 7A to 7D that the transistor according to the second embodiment of the present invention has the following structure. That is, the transistor includes the active area 1a vertically protruding from the predetermined portion of the semiconductor substrate 1 and the field oxide layer 2 is formed at both sides of the active area 1a. In addition, the first recess g1 having the depth d1 is formed in channel area of the active area 1a. Accordingly, the height Hc (FIG. 7C) of the channel section of the active area 1a is lower than the height Hs/d (FIG. 7D) of the source/drain sections S, D of the active area 1a by the depth d1 (FIG. 7A). The second recess g2 having the depth d2 and being connected to the first recess g1 is formed in the field oxide layer 2 in such a manner that the gate electrode 4 (FIG. 7A-7B) passes through the second recess g2. The second recess depth d2 of the second recess g2 is larger than the first recess depth d1 of the first recess g1. In addition, the low-resistant gate electrode 4, which crosses the upper portion of the active area 1a in an overlapping manner in and along the first and second recesses g1 and g2 of the active area 1a, is formed on the field oxide layer 2. The gate insulation layer 3 is interposed between the low-resistant gate electrode 4 and the active area 1a. The source and drain areas S and D are formed on the active area 1a at both sides of the gate electrode 4.

If the transistor is fabricated through the above process, the first conductive layer 4a to be patterned can be formed with the same thickness t2, so that the low-resistant gate electrode 4 can be easily fabricated by etching the first and second conductive layers 4a and 4b. Accordingly, it is possible to improve the yield rate of the transistors while reducing detects of the transistors.

In addition, since there is no step difference in height between the active area 1a protruding from the semiconductor substrate 1 and the field oxide layer 2 and since the first conductive layer 4a is formed on the active area 1a with the uniform thickness t2, the void is prevented from being created when depositing the second conductive layer 4b. Thus, the resistance of the low-resistant gate electrode 4 is prevented from being increased.

As described above, according to the present invention, the predetermined portion of the field oxide layer is selectively etched so as to allow the gate electrode to pass therethrough and the poly valley can be minimized by means of the polysilicon having a proper thickness. Therefore, the first conductive layer to be patterned may have the same thickness, so that the low-resistant gate electrode can be easily fabricated by etching the conductive layers. Accordingly, it is possible to improve the yield rate of the transistors. In addition, since the void cannot be formed when depositing the second conductive layer made from the low-resistant material on the first conductive layer, resistance of the low-resistant gate electrode can be prevented from being increased and process reliability can be improved.

Although a preferred embodiment of the present invention has been described for illustrative purposes, those skilled in the art will appreciate that various modifications, additions and substitutions are possible, without departing from the scope and spirit of the invention as disclosed in the accompanying claims.

What is claimed is:

1. A method of fabricating a transistor in a memory device having a semiconductor substrate, the method comprising the steps of:

forming an active area by etching the semiconductor substrate such that two trenches are formed on both sides of the active area and the active area protrudes from the substrate;

forming a field oxide layer in each trench to fill the trenches;

forming a first recess by etching a portion of the field oxide layer on one side of the active area while leaving unrecessed portions of the field oxide layer from which the active area does not protrude, and forming a second recess by etching a portion of the field oxide layer on the other side of the active area opposite to the one side while leaving unrecessed portions of the field oxide layer from which the active area does not protrude, wherein the first and second recesses are elongated in a common line between the unrecessed portions of the field oxide layer on both sides of the active area and wherein the first and second recesses expose predetermined side portions of the active area;

forming a gate insulation layer on the upper surface of the active area and the exposed side portions of the active area; and forming a gate electrode on the field oxide layer along the first and second recesses and on the active area such that the gate electrode crosses a portion of the active area and a portion of the field oxide layer while overlapping a channel area of the active area.

2. The method as claimed in claim 1, wherein the field oxide layer has a thickness of about 2000 to 6000 Å.

3. The method as claimed in claim 1, wherein the depth of each of the first and second recesses is substantially half the thickness of the field oxide layer.

4. The method as claimed in claim 1, wherein the gate electrode has a stacked structure of first and second conductive layers.

5. The method as claimed in claim 4, wherein the first conductive layer is made from polysilicon with a thickness of about 300 to 1500 Å.

6. The method as claimed in claim 4, wherein the second conductive layer is made from a low-resistant material of W, WN, $WSi_x$, or $TiSi_x$.

7. A method of fabricating a transistor in a memory device having a semiconductor substrate, the method comprising the steps of:

forming an active area by etching the semiconductor substrate such that two trenches are formed on both sides of the active area and the active area protrudes from the substrate;

forming a field oxide layer in each trench;

forming a channel recess in a portion of the active layer, the portion of the active layer being a channel area of the active area, such that the height at the channel area of the active area is lower than that of other sections of the active area;

forming a first recess by etching a portion of the field oxide layer on one side of the active area, and forming a second recess by etching a portion of the field oxide layer on the other side of the active area, wherein the first recess, the channel recess, and the second recess are elongated in a common line, and wherein the first and second recesses expose predetermined side portions below the channel recess of the active area;

forming a gate insulation layer on the upper surface of the active area and the exposed side portions of the active area; and forming a gate electrode on the field oxide layer and on the active area along the first recess, channel recess, and the second recess such that the gate electrode crosses the active area while overlapping the channel area of the active area.

8. The method as claimed in claim 7, wherein the field oxide layer has a thickness of about 2000 to 6000 Å.

9. The method as claimed in claim 7, wherein the depth of the channel recess is substantially one-third of the thickness of the field oxide layer.

10. The method as claimed in claim 7, wherein the depth of each of the first and second recesses is one-half to two-third of the thickness of the field oxide layer.

11. The method as claimed in claim 7, wherein the gate electrode has a stacked structure of first and second conductive layers.

12. The method as claimed in claim 11, wherein the first conductive layer is made from polysilicon with a thickness of about 300 to 1500 Å.

13. The method as claimed in claim 12, wherein the second conductive layer is made from a low-resistant material of W, WN, $WSi_x$, or $TiSi_x$.

14. The method as claimed in claim 7, wherein the first and second recesses and the channel recess are simultaneously formed by performing a photolithography process one time using chemical having etch selectivity between a silicon and an oxide.

15. The method as claimed in claim 1, wherein the step of forming the gate electrode on the field oxide layer comprises:

forming a first conductive layer such that the first conductive layer fills the first and second recesses and is formed over the field oxide layer and over the active area along the first and second recesses and such that first conductive layer crosses a portion of the active area and a portion of the field oxide layer while overlapping a channel area of the active area, wherein the first conductive layer is formed such that the thickness of the first conductive layer over the field oxide layer and the thickness of the first conductive layer over the active area is the same.

* * * * *